United States Patent [19]

Wynn

[11] Patent Number: 4,602,222
[45] Date of Patent: Jul. 22, 1986

[54] CIRCUIT FOR BANDSWITCHING A VOLTAGE CONTROLLED OSCILLATOR

[75] Inventor: Stephen R. Wynn, Lynchburg, Va.

[73] Assignee: General Electric Company, Schenectady, N.Y.

[21] Appl. No.: 724,977

[22] Filed: Apr. 19, 1985

[51] Int. Cl.[4] .............................................. H03B 0/00
[52] U.S. Cl. .................................. 331/179; 331/167; 331/177 V; 334/55; 455/176; 455/180
[58] Field of Search ............ 331/116 FE, 116 R, 167, 331/177 V, 179; 334/15, 55; 455/173, 176, 180, 188

[56] References Cited

U.S. PATENT DOCUMENTS

| | | | |
|---|---|---|---|
| 3,117,293 | 1/1964 | Mortley | 334/15 |
| 3,573,683 | 4/1971 | Marshall et al. | 334/15 |
| 3,813,615 | 5/1974 | Okazaki | 331/109 |
| 3,825,858 | 7/1974 | Amemiya et al. | 331/117 R |
| 3,866,138 | 2/1975 | Putzer | 331/60 |
| 3,980,957 | 9/1976 | Pützer | 455/180 |
| 4,247,953 | 1/1981 | Shinagawa et al. | 455/191 |
| 4,339,827 | 7/1982 | Torres et al. | 455/188 |
| 4,363,135 | 12/1982 | Moon | 455/180 |

Primary Examiner—Eugene R. LaRoche
Assistant Examiner—James C. Lee
Attorney, Agent, or Firm—M. Masnik; Robert C. Lampe, Jr.

[57] ABSTRACT

A circuit is provided which is capable of band switching a voltage controlled oscillator (VCO) while maintaining the relative sensitivity of the voltage controlled device and, hence, the control line voltage itself. The circuit includes an array of capacitors, including a pair of capacitors and a voltage variable capacitor (varactor), a switch, and a tuning coil. When the switch is in the open position, the pair of capacitors are connected in parallel with the varactor. When the switch is closed, the pair of capacitors are connected to ground, arraying themselves on opposite sides of the varactor. In this closed position, the overall capacitance of the tuned circuit increased, thus lowering the tuned frequency of the circuit. Since the switched capacitance (i.e., the capacitance which changes the tuned frequency of the circuit) is arrayed on both sides of the varactor, the varactor maintains its relative sensitivity.

7 Claims, 6 Drawing Figures

CIRCUIT FOR BANDSWITCHING A VOLTAGE CONTROLLED OSCILLATOR

BACKGROUND OF THE INVENTION

The present invention relates to voltage controlled oscillators (VCOs) and, more particularly, to a circuit for bandswitching a VCO while keeping control line sensitivity substantially constant.

Voltage controlled oscillators having an output frequency variable over some predetermined range according to an input control voltage are well known elements of communication equipment such as radios and televisions. It is also well known that in bandswitching a VCO using fixed capacitors (i.e. moving from a first to a second predetermined frequency band), the sensitivity of the VCO tank circuit changes, the sensitivity being related to the variation in output frequency with changing input control voltage. Generally, and absent some circuity to compensate for the effect, the frequency variation in the high band is different than (larger or smaller) the frequency variation in the low band, given the same change in input control voltage and depending on where the capacitance is added in the resonant circuit.

To compensate for this effect of varying sensitivity, the prior art includes circuits in which inductors are switched to maintain constant sensitivities when changing frequency ranges, or complex VCO designs utilizing multiple varactors or switches are employed. Examples of the foregoing are U.S. Pat. No. 3,813,615 to Okazaki, U.S. Pat. No. 3,825,858 to Amemiya et al, and U.S. Pat. No. 3,866,138 to Putzer.

While the foregoing patents primarily involve switching inductors, there are a number of reasons why switching capacitors is more desirable. One reason is that tapped or multiple coils are difficult to finely proportion for accurate frequency switching. Maintaining good tank quality factor, Q, related to the sharpness of the resonance frequency peak, can also be more difficult with inductor switching; and multiple coils take needed space in this era of miniaturization of electronic circuitry. However, simple capacitor changes either need more complex VCO designs or they change VCO sensitivity drastically. Accordingly, complex VCO designs have been employed, but they require multiple electronic switches which, in turn, utilize multiple components which can be expensive, space consuming and/or unreliable.

SUMMARY OF THE INVENTION

Accordingly, it is the primary object of the present invention to provide an oscillator tank circuit for bandswitching a VCO while keeping control line sensitivity substantially constant.

It is a further object of the present invention to employ capacitor switching in an oscillator tank circuit for bandswitching a VCO.

It is yet another object to accomplish bandswitching while maintaining control line sensitivity using fewer parts, particularly switches, than heretofore.

These and other objects and advantages will be more clearly understood from the following detailed description, drawings and specific examples, all of which are intended to be typically rather than in any way limiting to the scope of the present invention.

Briefly stated, the above objectives are accomplished in one embodiment of the present invention in which a voltage variable capacitor (varactor) receiving the control line voltage input produces an output signal frequency for an oscillator circuit. A capacitive device divided into two portions is switched at the connecting point of the divided capacitor sections whereby the capacitive device is shunted across the voltage variable capacitor in the high frequency band mode of operation. In low frequency band operation, the capacitive device is switched to ground, the two portions simultaneously arraying themselves on opposite sides of the varactor. In this closed position, the overall capacitance of the tuned circuit increases, thus lowering the tuned frequency of the circuit. Since the switched capacitance (i.e. the capacitance which changes the tuned frequency of the circuit) is arrayed on both sides of the varactor, the varactor maintains sensitivity.

BRIEF DESCRIPTION OF THE DRAWINGS

While the specification concludes with claims particularly pointing out and distinctly claiming the subject matter which is regarded as part of the present invention, it is believed that the invention will be more fully understood from the following description of the preferred embodiment which is given by way of example with the accompanying drawings in which:

DESCRIPTION OF THE PREFERRED EMBODIMENT

Figure 1:
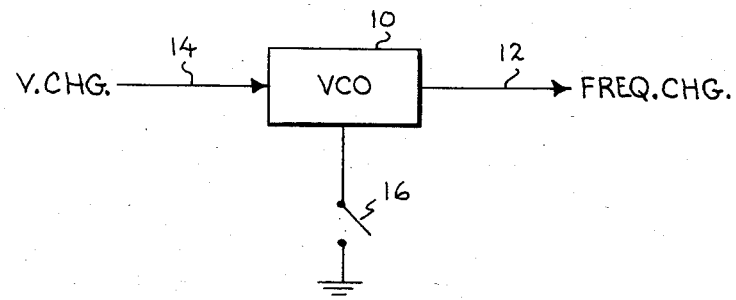
FIG. 1 is a schematic diagram of a prior art voltage controlled oscillator circuit.

Referring to the drawings wherein like numerals correspond to like elements throughout, attention is first directed to FIG. 1 wherein a well-known voltage controlled oscillator (VCO) 10 having an output frequency signal 12 which is variable over some range according to an input control voltage 14 is depicted. Switch 16 is used to switch from one frequency band to another. In the case of a two-way radio, this could represent switching between the upper and lower halves of the 150 to 174 MHz band, for example, as switch 16 is closed.

Figure 2:
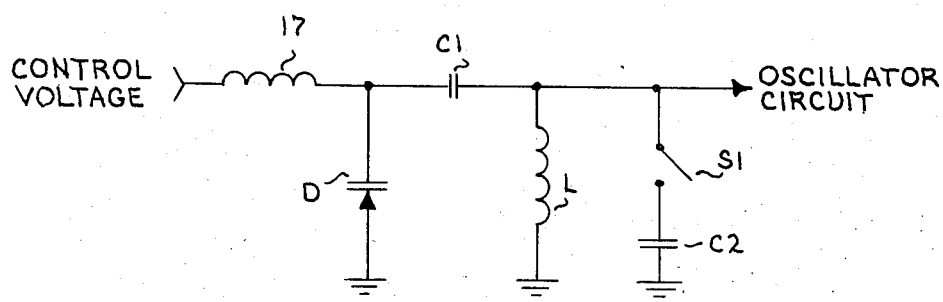
FIG. 2 is a schematic representation of a typical oscillator tank circuit.
Figure 3A:
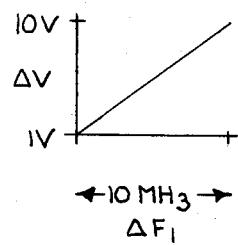
FIGS. 3a and 3b are graphic representations of the sensitivity associated with the low and high frequency bands, respectively, of the oscillator tank circuit of FIG. 2.
Figure 3B:
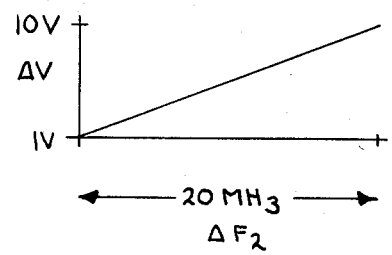

It is well known that in bandswitching a VCO using a capacitor, the sensitivity of the circuit also changes. Considering the typical oscillator tank circuit of FIG. 2 comprising voltage variable capacitor (varactor) D, capacitor C1 and tank coil L, driven by a control voltage through choke 17 and connecting to an oscillator circuit, sensitivity increases at the higher frequency band when compared to the lower frequency band as capacitor C2 is switched through switch S1. This is represented schematically in FIGS. 3a and 3b, which represent the change in frequency with changing control voltage at the low and high frequency bands, respectively. Equal changes in control voltage produce substantially greater frequency change, $\Delta F2$, at the higher frequency band. This has the disadvantage of increasing single sideband noise at the higher frequency. To reduce the noise level at the higher frequency, it would be desirable to reduce ΔF2 to approximate that of the lower band, namely ΔF1, which can be done by reducing the control voltage change to about half of what it is in FIG. 3b. Of course, this also reduces ΔF1, to about half the desired frequency range.

Figure 4:
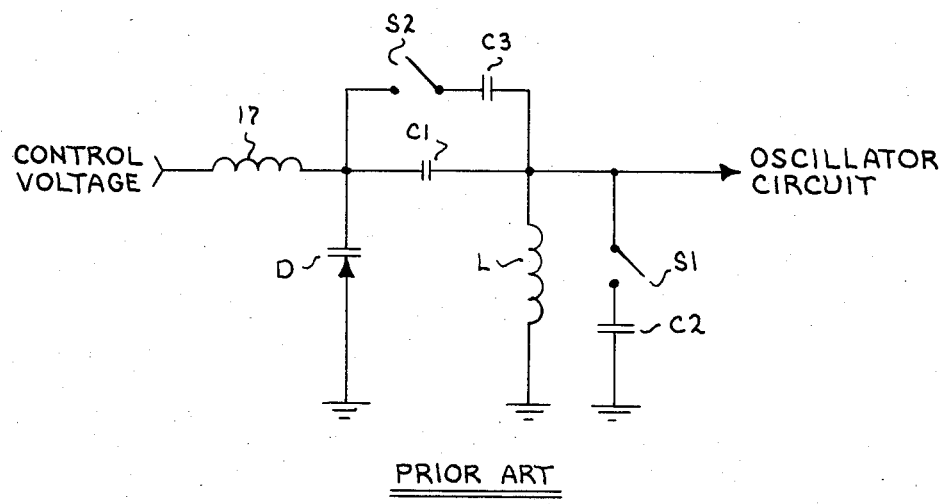
FIG. 4 is a schematic diagram of a prior art oscillator tank circuit designed for constant sensitivity between high and low frequency bands.

Prior art systems have recognized this problem and circuits have been developed to keep the sensitivity substantially constant over the entire frequency range of the VCO by balancing frequency range against noise to provide good synthesizer loop performance. One prior art solution is depicted in FIG. 4. It is well known that adding capacitance to the tank circuit alters the circuit sensitivity and, depending on where it is added, it may either increase or decrease the sensitivity. The circuit of FIG. 4 is one which attempts to balance the effects and keep sensitivity substantially constant over the frequency range of interest. Capacitor C3 added in parallel with capacitor C1 tends to increase the sensitivity of the VCO, whereas adding capacitance C2 across inductor L tends to decrease sensitivity. Capacitor C3 is brought into the circuit by closing switch S2, whereas capacitor C2 is enabled by switch S1. Switches S1 and S2 are activated simultaneously (both open/both closed) when switching between high/low bands, respectively. Of course, the values of C2 and C3 will depend on the circuit selected and, in particular on the values of capacitor C1, varactor D and tuning coil L. It is well within the ability of one skilled in the art to select the proper values. Once the total effects of capacitors C2 and C3 are balanced, then the frequency range can change while the VCO sensitivity remains constant.

Thus, in capacitor switched prior art VCO circuits, the sensitivity effect is balanced by switching in both C2 and C3 at the appropriate lower frequency band through simultaneous closure of switches S1 and S2. Switches S1 and S2 are not simple mechanical switches but, rather, complex electronic switches having multiple components. Whereas the capacitors and inductor of the VCO tank circuit are relatively inexpensive, the electronic switches add significant cost to the system. The present invention is intended to accomplish the same function with only one switch and, therefore, significantly less circuit cost.

Figure 5:
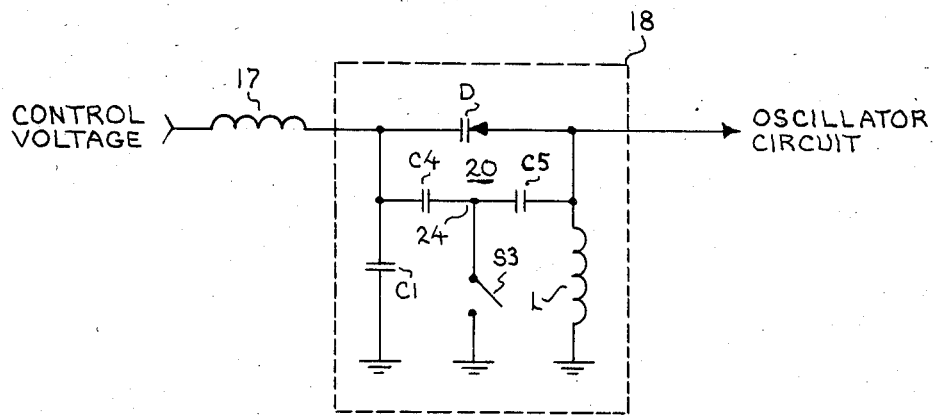
FIG. 5 is a schematic representation of the improved oscillator tank circuit of the present invention.

Referring now to FIG. 5, there is depicted an improved oscillator tank circuit 18 in accordance with the preferred embodiment of the present invention in which the positions of varactor D and capacitor C1 have been interchanged compared to the prior art device of FIG. 4. This produces a configuration which can be further modified to accomplish the objective of adding capacitance in parallel with tuning coil L and in series with diode D, as does the prior art embodiment of FIG. 4, but using only one switch. A capacitive element 20 connected in parallel with varactor D is divided into two portions, C4 and C5, and a switch S3 is connected between the connection point 24 of the divided capacitor portions C4, C5 and ground. Tuning coil L is connected to ground as previously, and capacitor C1 (replacing varactor D of the prior art circuit) is likewise grounded. Note that varactor D can be any array of similar diodes(including multiple or back-to-back varactors) per the designer's choice.

With switch S3 open, the effect is to add some small capacitance in parallel with varactor D, thereby decreasing coupling and decreasing sensitivity. This added capacitance has the tendency to decrease the total effect of varying varactor D's capacitance (and, thus, the VCO sensitivity). This can be compensated for by slightly increasing the capacitance of C1 and decreasing the inductance of tuning coil L to return to the desired sensitivity. By properly selecting the value of capacitors C1, C4 and C5, the desired degree of sensitivity in the high and low bands can be obtained.

With switch S3 closed, the effect is to add capacitance directly to ground in parallel with inductance L, while capacitor C4 is switched directly to ground, thereby increasing coupling in the low frequency band. An iterative procedure may be required to provide both the proper frequency band change and proper sensitivity in both bands by varying the values of capacitors C1, C4 and C5 and inductance L. Once determined, however, the design is complete and will perform properly under normal circumstances.

Of course, the values of C1, C4 and C5 will have to be judiciously selected with respect to any particular application and other circuit parameters, but it is clear that the present invention has accomplished with one switch (either mechanical or electronic) what the prior art required to be done with two, with the total number of other components remaining the same, though of somewhat different capacities.

The best mode contemplated for carrying out this invention has been set forth in the description above. In particular, this has been accomplished by setting forth the preferred electrical arrangement incident to successful practicing (including making and using) of the invention in the best way contemplated at the time of executing this patent application.

It should be obvious to one skilled in the art that certain changes can be made to the above-described invention without departing from the broad inventive concepts thereof. For example: diode or varactor D could be replaced by multiple diodes and associated circuitry; and, switch S3 may be more simply approximated by a transistor switch to ground rather than a more complex pin diode arrangement. It is intended that the appended claims cover these and all other variations in the present invention's broader inventive concepts.

Having thus described the invention, what is claimed and desired to be secured by Letters Patent of the U.S. is:

1. An oscillator tank circuit for bandswitching a voltage controlled oscillator while keeping control line sensitivity substantially constant comprising:
   a varactor for receiving a control line input and for producing an output signal.
   a first capacitor connected between said control line input and ground;
   a tuning coil connected between said varactor output and ground;
   series connected second and third capacitors connected in parallel with said varactor; and
   switch means for simultaneously arraying said second and third capacitors on opposite sides of said varactor while connecting them to ground, thereby increasing the overall tuned capacitance of the circuit while maintaining control line sensitivity.

2. The oscillator tank circuit of claim 1 wherein said switch means comprises a mechanical switch.

3. The oscillator tank circuit of claim 1 wherein said switch means comprises an electrical switch.

4. An oscillator tank circuit for bandswitching a voltage controlled oscillator while keeping control line sensitivity substantially constant comprising:

a varactor for receiving a control line input and for producing an output signal;

a first capacitor connected between said control line input and ground;

an inductor connected between said varactor output and ground;

series connected second and third capacitors connected across said varactor; and means for simultaneously switching said second and third capacitors to ground across said first capacitor and said inductor, respectively.

5. A circuit for bandswitching a voltage controlled oscillator while keeping control line sensitivity substantially constant comprising:

a varactor electrically coupled between a first capacitor and a tank coil, both of which are also connected to ground;

series connected second and third capacitors connected in parallel with said varactor; and means for simultaneously switching said second capacitor across said first capacitor, and said third capacitor across said tank coil.

6. An oscillator tank circuit for bandswitching a voltage controlled oscillator comprising:

a varactor electrically coupled between a first grounded capacitor and a grounded tank coil; and means for simultaneously adding capacitance across said first capacitor and said tank coil while keeping control line sensitivity substantially constant.

7. The oscillator tank circuit of claim 6 wherein said means for adding capacitance comprises:

series connected second and third capacitors connected in parallel with said varactor; and a switch connected between the connection point of said second and third capacitors and ground whereby, when said switch is open said second and third capacitors are connected across said varactor, and when said switch is closed said second and third capacitors are connected to ground across said first capacitor and said tank coil, respectively, thereby increasing the overall capacitance of said circuit.

* * * * *